(12) United States Patent
Ma et al.

(10) Patent No.: US 8,939,791 B2
(45) Date of Patent: Jan. 27, 2015

(54) PRIMARY CIRCUIT BOARD NON-CONDUCTIVE VOID HAVING DIFFERENT PLANAR DIMENSIONS THROUGH BOARD THICKNESS TO SECURE NON-CONDUCTING LOCKING MEMBER OF HOLDER

(71) Applicant: International Business Machines Corporation, Armonk, NY (US)

(72) Inventors: Wai M. Ma, Poughkeepsie, NY (US); James E. Tersigni, Highland, NY (US); Jefferson L. Watson, Wallkill, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 13/751,130

(22) Filed: Jan. 27, 2013

(65) Prior Publication Data

US 2014/0213077 A1 Jul. 31, 2014

(51) Int. Cl.
*H01R 13/60* (2006.01)
*H01R 12/52* (2011.01)

(52) U.S. Cl.
CPC ..................................... *H01R 12/52* (2013.01)
USPC ........................................................ 439/567

(58) Field of Classification Search
USPC ................................................. 439/567, 329
See application file for complete search history.

(56) References Cited

U.S. PATENT DOCUMENTS 4,129,351 A * 12/1978 Sugimoto et al. ............. 439/325
4,427,328 A * 1/1984 Kojima ......................... 411/508
4,664,458 A * 5/1987 Worth ............................. 439/82
5,228,870 A 7/1993 Gorenc
6,027,358 A 2/2000 Lai
6,123,580 A 9/2000 Bendorf
6,619,991 B2 9/2003 Nishio
6,700,800 B2 * 3/2004 Combs et al. ................. 361/825
6,733,334 B2 5/2004 Chen
6,824,424 B2 11/2004 Hattori (Continued)

FOREIGN PATENT DOCUMENTS

EP 798816 A2 10/1997
JP 10040979 A 2/1998

OTHER PUBLICATIONS

DDK Ltd., Power Board to Board Connector, PD3 Series, www.ddknet.co.jp, PDF dated Sep. 26, 2012.

(Continued)

*Primary Examiner* — Phuong Dinh
(74) *Attorney, Agent, or Firm* — Damion Josephs

(57) ABSTRACT

A primary circuit board has a front surface, a back surface, and a non-conductive void. The void has first planar dimensions through a first portion of a thickness of the primary circuit board extending from the front surface to a position between the front and back surfaces, and second planar dimensions through a second portion of the thickness extending from the position at least towards the back surface. A secondary circuit board holder includes a non-conducting locking member insertable into the non-conductive void at the primary circuit board's front surface to secure the holder while a conductive part of the holder is conductively affixed to a conductive part of the primary circuit board. The first planar dimensions are different than the second planar dimensions to permit the primary circuit board's thickness to be greater than a maximum thickness specification of the holder's non-conducting locking member.

19 Claims, 3 Drawing Sheets

(56) References Cited

U.S. PATENT DOCUMENTS 7,914,325 B2 * 3/2011 Baba et al. .................. 439/567
8,123,572 B2   2/2012 Sharf

OTHER PUBLICATIONS

R. Hilty, "Achieving lead free connectors and processes," IICIT Annual Conference, Oct. 2001.

* cited by examiner

PRIMARY CIRCUIT BOARD NON-CONDUCTIVE VOID HAVING DIFFERENT PLANAR DIMENSIONS THROUGH BOARD THICKNESS TO SECURE NON-CONDUCTING LOCKING MEMBER OF HOLDER

BACKGROUND

Electronic devices commonly include a primary circuit board, such as a printed circuit board, on which electronic components are mounted. In addition, many electronic devices include one or more secondary circuit boards, such as printed circuit boards, which are conductively connected to the primary circuit board. Some secondary circuit boards are directly and permanently affixed to the primary circuit board. Other secondary circuit boards are connected to the primary circuit board via holders, such as sockets. The holders are directly and permanently affixed to the primary circuit board. The secondary circuit boards are then removably inserted into the holders. Common secondary circuit boards of this type include memory modules, like dual-inline memory modules (DIMMs).

SUMMARY

An example circuit board assembly of the disclosure includes a primary circuit board and a holder receptive to a secondary circuit board. The primary circuit board has a front surface, a back surface, and a non-conductive void. The non-conductive void has first planar dimensions through a first portion of a thickness of the primary circuit board extending from the front surface to a position between the front surface and the back surface. The non-conductive void has second planar dimensions through a second portion of the thickness extending from the position at least towards the back surface. The first planar dimensions are different than the second planar dimensions. The holder includes a non-conducting locking member insertable into the non-conductive void at the front surface of the primary circuit board to secure the holder to the front surface of the primary circuit board while a conductive part of the holder is conductively affixed to a conductive part of the primary circuit board.

An example circuit board of the disclosure includes a substrate having a front surface, a back surface, and a thickness defined from the front surface to the back surface. The circuit board includes a conductive part receptive to conductive affixing to a conductive part of a secondary circuit board holder. The circuit board includes a non-conductive void. The non-conductive void includes first planar dimensions through a first portion of the thickness from the front surface to a position between the front surface and the back surface, and second planar dimensions through a second portion of the thickness from the position at least towards the back surface. The first planar dimensions are different than the second planar dimensions. The non-conductive void is receptive to insertion of a non-conducting locking member of the secondary circuit board holder to secure the secondary circuit board while the conductive part of the secondary circuit board holder is conductively affixed to the conductive part of the circuit board.

An example method of the disclosure includes configuring a non-conducting locking member of a secondary circuit board holder into an insertion state. The method includes, while the non-conducting locking member is in the insertion state, inserting the non-conducting locking member into a non-conductive void of a primary circuit board. The non-conductive void has a front surface and a back surface. The non-conductive void has first planar dimensions through a first portion of a thickness of the primary circuit board extending from the front surface to a position between the front surface and the back surface, and second planar dimensions through a second portion of the thickness extending from the position at least towards the back surface. The first planar dimensions are different than the second planar dimensions. The method includes, once the non-conducting locking member has been inserted into the non-conductive void, configuring the non-conducting locking member into a locking state in which the secondary circuit board holder is secured to the front surface of the primary circuit board. The method includes, while the non-conducting locking member is in the locking state, conductively affixing a conductive part of the secondary circuit board holder to a conductive part of the primary circuit board.

BRIEF DESCRIPTION OF THE SEVERAL VIEWS OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

DETAILED DESCRIPTION

Figure 1:
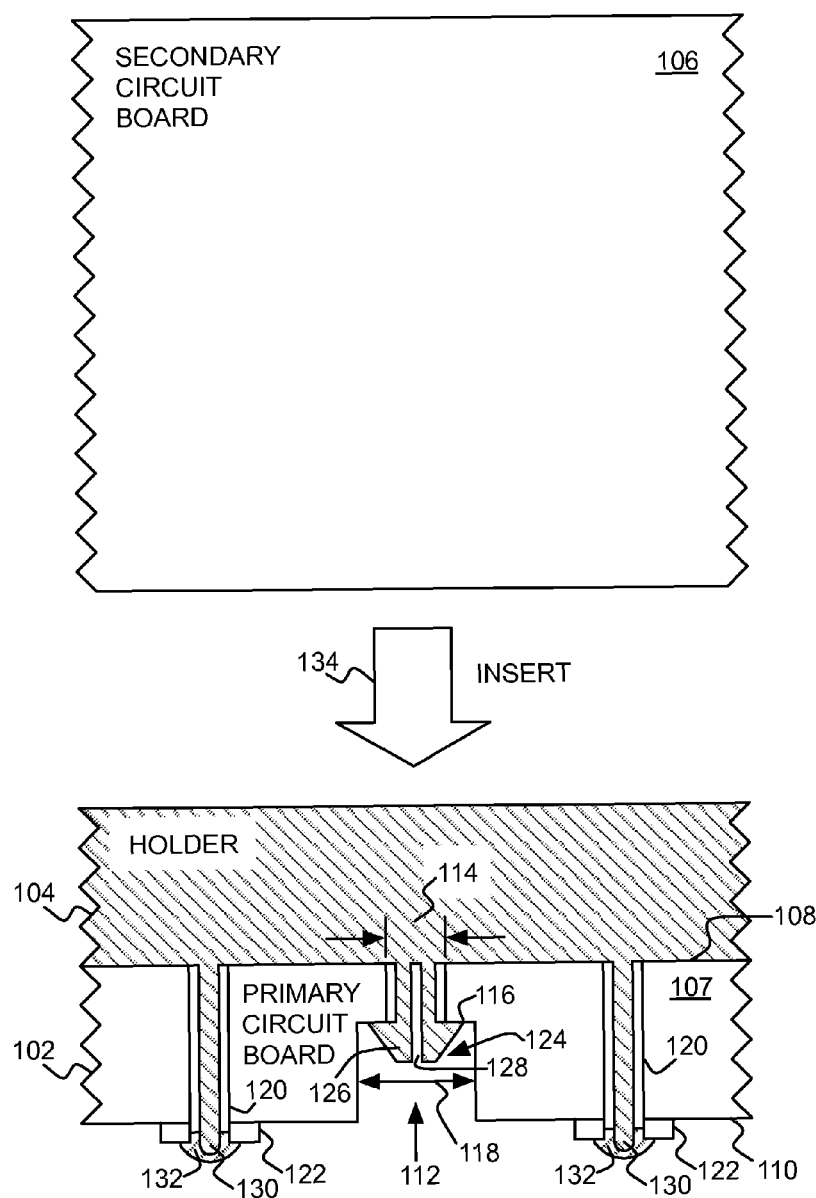
FIG. 1 is a diagram of an example circuit board assembly including a primary circuit board and a holder receptive to a secondary circuit board.

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure. Readers of the following detailed description should, therefore, not interpret the description in a limiting sense, and only the appended claims define the scope of the embodiment of the disclosure.

As noted in the background section, many electronic devices, such as computing devices, include a primary circuit board and one or more secondary circuit boards, which may be conductively connected to the primary circuit board via removable insertion into holders, such as sockets, which are directly and permanently affixed to the primary circuit board. A holder is thus conductively connected to the primary circuit board, and the insertion of a secondary circuit board into the holder results in the secondary circuit board being conductively connected to the holder. In this way, the secondary circuit board becomes conductively connected to the primary circuit board.

During manufacture of a circuit board assembly including a primary circuit board and a holder receptive to insertion of a secondary circuit board, a conductive part of the holder is conductively affixed to a conductive part of the primary circuit board. For instance, the conductive parts of the holder and the primary circuit board may be soldered to one another to provide for a solid and secure connection therebetween. During this conductive affixing process, the holder has to be secured to the primary circuit board to ensure the integrity of the process.

Some holders include non-conducting locking members that are inserted into corresponding non-conductive through-holes of primary circuit boards to secure them to the primary circuit boards. After a non-conducting locking member of a holder has been inserted into a corresponding non-conductive through-hole of a primary circuit board, the conductive part of the holder can then be conductively affixed to the conductive part of the primary circuit board. Insertion of the non-conducting locking member of the holder into the non-conductive through-hole of the primary circuit board secures the holder to the primary circuit board and thus ensures the integrity of the conductive affixing process.

The non-conducting locking member of a holder can include two or more fingers that have flared ends. The fingers are compressed against one another for insertion into the non-conductive through-hole of a primary circuit board from the board's front surface. Once the fingers have been inserted in this manner, releasing the fingers from their compressed state results in the flared ends thereof being secured against the board's back surface. In this way, the holder is secured to the primary circuit board so that the conductive part of the former can then be conductively affixed to the conductive part of the latter.

However, the fingers have a finite length, and as such can be used with primary circuit boards that have a given maximum thickness in correspondence with this length. This is problematic, because circuit board technology has resulted in primary circuit boards increasing in thickness. For instance, primary circuit boards have increasing number of layers to realize more complex and/or faster electronic devices. A holder having a non-conducting locking member designed for a primary circuit board of a given thickness generally cannot be used for its intended purpose with a primary circuit board that has a greater thickness.

Two limited solutions to this problem are as follows. First, new holders can be developed that have non-conducting locking members that can be used with thicker primary circuit boards, albeit not with circuit boards of lesser thicknesses. However, this solution is a problem, because it requires circuit board assembly manufacturers to stock an increasing array of holders, with different holders having non-conducting locking members that can be used with different primary circuit boards of different thicknesses.

Second, fixtures and tools have been developed to temporarily clamp or otherwise secure a holder to a primary circuit board while the conductive part of the former is conductively affixed to the conductive part of the latter. This solution is also problematic. Usage of such fixtures and tools increases manufacturing time and thus expense. Different fixtures and tools may be required for different combinations of primary circuit board types and holder types, requiring manufacturers to have a relatively large number of such fixtures and tools on hand.

Disclosed herein are techniques to address these problems. A primary circuit board having a front surface and a back surface includes a non-conductive void. The non-conductive void has planar dimensions from the front surface towards a position between the front and back surfaces that are different than planar dimensions from this position towards the back surface. From the perspective of a non-conducting locking member of a holder receptive to a secondary circuit board, the thickness of the primary circuit board is effectively reduced to a thickness extending from the front surface towards this position.

For instance, whereas conventionally the flared ends of the fingers of a non-conducting locking member of a holder would be secured against the back surface of the primary circuit board, in accordance with the techniques disclosed herein the flared ends are instead secured at a position (e.g., a surface) between the front and back surfaces of the circuit board. As a concrete example, the non-conductive void may be a counterbore having a larger diameter and a smaller diameter throughout the thickness of the primary circuit board. The flared ends of the fingers are secured to the primary circuit board at the surface of the counterbore at which the smaller diameter transitions to the larger diameter.

Such a non-conductive void permits the thickness of a primary circuit board to be greater than the otherwise specified or permitted maximum circuit board thickness of the non-conducting locking member of a holder. Stated another way, holders that have non-conducting locking members that conventionally are operable for circuit boards of or up to a given maximum thickness can now be used with circuit boards that have even greater thicknesses. A manufacturer does not have to stock holders for different primary circuit boards of differing thickness. A manufacturer does not have to have on hand nor use specialized tools or fixtures to secure holders to primary circuit boards when conductively affixing the conductive parts of such holders to the conductive parts of thicker primary circuit boards.

FIG. 1 shows a cross-sectional profile of a portion of an example circuit board assembly 100. The circuit board assembly 100 includes a primary circuit board 102 and a holder 104, the latter receptive to a secondary circuit board 106. As an example, the circuit board assembly 100 may be for a computing device like a computer, where the primary circuit board 102 is the computing device's motherboard, the holder 104 is a memory module socket, and the secondary circuit board 106 is a memory module like a dual-inline memory module (DIMM).

The primary circuit board 102 includes a substrate 107, which may itself include one or more layers, including at least one non-conductive layer. The substrate 107, and hence the primary circuit board 102, has a front surface 108 and a back surface 110; a (total) thickness of the primary circuit board 102 is defined between the front surface 108 and the back surface 110. A non-conductive void 112 is defined from the front surface 108 to the back surface 110. In the example of FIG. 1, the non-conductive void 112 is a counterbore. The non-conductive void 112 is non-conductive in that no part of the primary circuit board 102 that is immediately adjacent to the void 112 is electrically conductive. For instance, the sidewalls of the counterbore in FIG. 1 are non-conductive.

The non-conductive void 112 has first planar dimensions through a first portion of the thickness of the primary circuit board 102 extending from the front surface 108 to a position 116 between the front surface 108 and the back surface 110. The position 116 is a surface in the example of FIG. 1. The first planar dimensions in the example of FIG. 1 correspond to a diameter 114 of the counterbore between the front surface 108 and the position 116. The dimensions are planar in that they are measured in relation to or on the front surface 108, which is planar.

The non-conductive void 112 has second planar dimensions through a second portion of the thickness of the primary circuit board 102 extending from the position 116 to the back surface 110. The second planar dimensions in the example of FIG. 1 correspond to a diameter 118 of the counterbore between the position 116 and the back surface 110. The dimensions are planar in that they are measured in relation to or on the back surface 110, which is planar.

The first and second planar dimensions of the non-conductive void 112 are in general different from one another. In the particular example of FIG. 1, the first planar dimensions are less than the second planar dimensions. This is because the (minimum) diameter 114 of the counterbore is less than the (maximum) diameter 118 of the counterbore.

The primary circuit board 102 in the example of FIG. 1 also includes a number of through holes 120 that extend from the front surface 108 through to the back surface 110 and that end at solder pads 122 on the back surface 110. The through holes 120 may be conductively plated. Although two through holes 120 are depicted in FIG. 1, there are typically more than two such through holes 120. The solder pads 122 and/or the through holes 120 may be considered a conductive part of the primary circuit board 102.

The holder 104 includes a non-conducting locking member 124. The locking member 124 is non-conducting in that at least some if not the entire member 124 is not electrically conductive. For instance, first, the locking member 124 may be non-conducting at least at its surface that will come into contact with the primary circuit board 102. Second, the non-conducting locking member 124 does not make electrical contact with the primary circuit board 102, and is not intended to make electrical contact with the circuit board 102. In the example of FIG. 1, the non-conducting locking member 124 includes a number of fingers 126 that have flared ends, and that define a gap 128 therebetween in a locking state, or non-compressed state. However, in other implementations, the non-conducting locking member 124 may take a different form.

The holder 104 in the example of FIG. 1 also includes a number of conductive pins 130. Although two conductive pins 130 are depicted in FIG. 1, there are typically more than two such conductive pins 130. In general, the number of conductive pins 130 of the holder 104 is usually equal to the number of through holes 120 of the primary circuit board 102. The conductive pins 130 may be considered as a conductive part of the holder 104.

The holder 104 is mated and affixed to the primary circuit board 102 as follows. The pins 130 of the holder 104 are aligned with corresponding through holes 120 of the primary circuit board 102. Similarly, the non-conducting locking member 124 of the holder 104 is aligned with the non-conductive void 112 of the primary circuit board 102. The holder 104 can then be mated to the primary circuit board 102 via insertion of the pins 130 into the through holes 120 and insertion of the non-conducting locking member 124 into the non-conductive void 112.

In the example of FIG. 1, the non-conducting locking member 124 of the holder 104 is inserted into the non-conductive void 112 of the primary circuit board 102 as follows. The fingers 126 are pushed towards one another to reduce or eliminate the gap 128 therebetween to enter an insertion, or compressed state. The fingers 126 may be compressed by using a tool like pliers or by a user using his or her fingers to push the fingers 126 together.

Insertion of the non-conducting locking member 124 into the non-conductive void 112 may itself also or alternatively cause the fingers 126 to be pushed towards one another due to the diameter 114 of the counterbore being less than a maximum diameter of the flared ends of the fingers 126 in the non-compressed, or locking state. The non-conducting locking member 124 can still through the non-conductive void 112 from the front surface 108 to the position 116, however, because in the compressed, or insertion state the maximum diameter of the flared ends of the fingers 126 is less than or equal to the diameter 114 of the counterbore. The reduction or elimination of the gap 128 between these two states causes the maximum diameter of the flared ends of the fingers 126 to transition from being greater than the diameter 114 of the counterbore to being less than or equal to the diameter 114 of the counterbore.

When the flared ends of the fingers 126 have been pushed through the diameter 114 of the counterbore and thus past the position 116, the non-conducting locking member 124 enters the locking, or non-compressed state again. In this state, the flared ends of the fingers 126 are secured against the position 116 between the front surface 108 and the back surface 110 of the primary circuit board 102. As such, the non-conducting locking member 124 secures the holder 104 to the front surface 108 of the primary circuit board 102.

Once the holder 104 has been secured to the primary circuit board 102 via the cooperative interaction between the non-conducting locking member 124 and the non-conductive void 112 in this manner, the pins 130 of the holder 104 can be conductively affixed to the solder pads 122 of the circuit board 102. For example, the pins 130 may be conductively affixed to the solder pads 122 via solder 132. In general, the conductive part of the holder 104 is conductively affixed to the conductive part of the primary circuit board 102.

Due to the non-conductive void 112, from the perspective of the non-conducting locking member 124 the thickness of the primary circuit board 102 is effectively decreased. Although the primary circuit board 102 in actuality has a (total) thickness extending from the front surface 108 to the back surface 110, from the perspective of the non-conducting locking member 124 the primary circuit board 102 has an effective thickness extending from the front surface 108 to the position 116. Because the first and second planar dimensions of the non-conductive void 112—i.e., the diameters 114 and 118 of the counterbore in the example of FIG. 1—are different, the thickness of the primary circuit board 102 can be greater than a specified or rated maximum circuit board thickness of the non-conducting locking member 124. If the flared ends of the fingers 126 were to have to be pushed through the primary circuit board 102 from the front surface 108 completely through and to the back surface 110, the (total) thickness of the primary circuit board 102 would have to be less than in FIG. 1 for the non-conducting locking member 124 of FIG. 1 to secure the holder 104 to the primary circuit board 102.

Once the holder 104 has been conductively affixed to the primary circuit board 102, the secondary circuit board 106 can be inserted into the holder 104, as indicated by the arrow 134 in FIG. 1. The holder 104 may have a pair of brackets (not shown in FIG. 1) at its ends that secure the secondary circuit board to the holder 104, as is typically the case for a memory module socket for instance. The secondary circuit board 106 is typically removably insertable into the holder 104, so, for instance, if the secondary circuit board 106 fails, it can be removed and a replacement inserted in its place, so the secondary circuit board 106 can be easily upgraded. The holder 104 makes conductive contact with each of the primary circuit board 102 and the secondary circuit board 106, and in this way permits the circuit boards 102 and 106 to be electrically connected to one another.

The non-conducting locking member 124 of the holder 104 and the non-conductive void 112 of the primary circuit board 102 do not, however, have any role in the electrical connection between the holder 104 and the primary circuit board 102, beyond securing of the holder 104 to the circuit board 102 for subsequent conductive affixing of the holder 104 to the board 102. For instance, this means that the non-conducting locking member 124 is not also one of the conductive pins 130 of the holder 104. This means further that the non-conductive void 112 is also not one of the through holes 120 of the primary circuit board 102.

In the example of FIG. 1, the non-conductive void 112 is in the form of a counterbore. However, in other implementations, the non-conductive void 112 may be in a different form. Two examples are described herein with reference to FIGS. 2 and 3, although the non-conductive void 112 can take a different form, other than that of FIG. 1, FIG. 2, or FIG. 3, as well.

Figure 2:
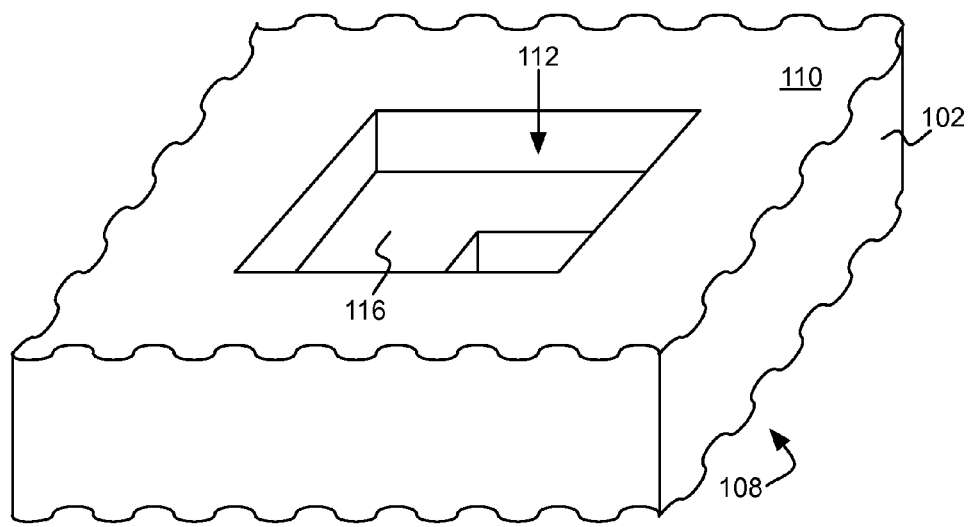
FIG. 2 is a diagram of an example primary circuit board different than that of FIG. 1.

FIG. 2 shows a perspective view of a portion of an example primary circuit board 102 in which the non-conductive void 112 is in the form of a polygonal slot, such as a rectangular slot as explicitly shown in FIG. 2. The perspective view of FIG. 2 is from the back surface 110 so that the position 116, which is a surface, is visible. The polygonal slot thus is larger at the back surface 110 than it is at the front surface 108. That is, the polygonal slot has a greater surface, or planar area at the back surface 110 than it does at the front surface 108. As such, the non-conductive void 112 of FIG. 2 still has first planar dimensions through a first portion of a thickness of the primary circuit board 102 that are different (and specifically smaller in FIG. 2) than second planar dimensions through a second portion of the thickness. In cross-sectional profile, non-conductive void 112 in the example of FIG. 2 may be identical to that of FIG. 1.

Figure 3:
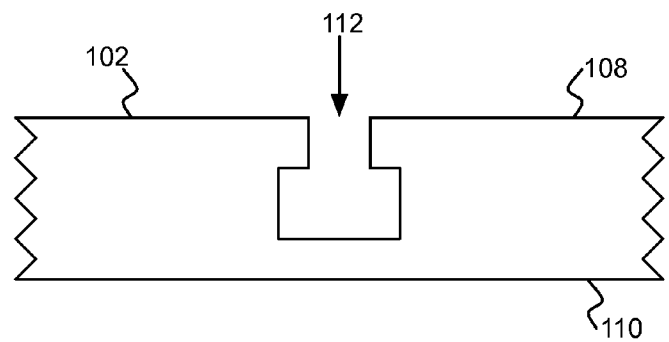
FIG. 3 is a diagram of an example primary circuit board different than those of FIGS. 1 and 2.

FIG. 3 shows a cross-sectional profile of a portion of an example primary circuit board 102 in which the non-conductive void 112 is in the form of a pocket, which may be polygonal, circular, or another shape. The pocket differs from the slot and counterbore of FIGS. 2 and 1, respectively, in that the pocket does not extend all the way through the primary circuit board 102 to the back surface 110, but rather extends from the front surface 108 towards (but not completely through) to the back surface 110. The pocket is smaller at the front surface 108 than it is towards the back surface 110. That is, the pocket has a smaller surface, or planar area at the front surface 108 than it does at the back surface 110. As such, the non-conductive void 112 of FIG. 3 still has first planar dimensions through a first portion of a thickness of the primary circuit board 102 that are different (and specifically smaller in FIG. 2) than second planar dimensions through a second portion of the thickness.

In the example of FIG. 1, the holder 104 is conductively affixed to the primary circuit board 102 in a (potentially plated) through hole manner. Conductive pins 130 of the holder 104 are inserted into through holes 120 of the primary circuit board 102, and soldered via solder 132 to solder pads 122 of the circuit board 102. However, in other implementations, the holder 104 can be conductively affixed to the primary circuit board 102 in a different manner. One such example is described herein with reference to FIG. 4, which shows a surface mount technology (SMT) manner.

Figure 4:
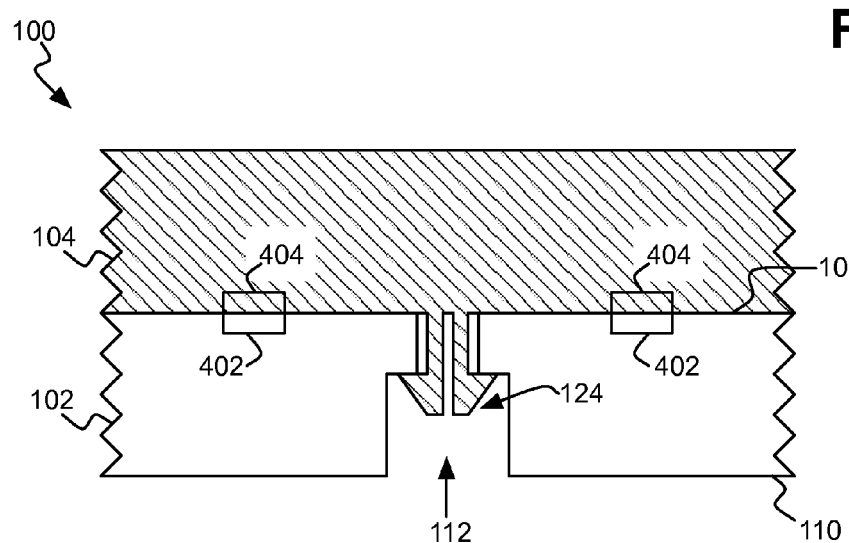
FIG. 4 is a diagram of an example circuit board assembly in which a holder is conductively affixed to a primary circuit board in a different manner than that of FIG. 1.

FIG. 4 shows an example of a circuit board assembly 100 that again includes the primary circuit board 102 and the holder 104. The secondary circuit board 106 is not depicted in FIG. 4 for illustrative convenience. As has been described above, the primary circuit board 102 has a non-conductive void 112 into which a non-conducting locking member 124 of the holder 104 is inserted to secure the holder 104 to the primary circuit board 102 while a conductive part of the former is being conductively affixed to a conductive part of the latter.

In the example of FIG. 4, however, the conductive part of the primary circuit board 102 includes one or more surface mount components 402. Similarly, the conductive part of the holder 104 includes one or more surface mount components 404. The surface mount components 404 of the holder 104 typically are equal in number to the surface mount components 402 of the primary circuit board 102. After insertion of the non-conducting locking member 124 of the holder 104 into the non-conductive void 112 of the primary circuit board 102 to secure the holder 104 to the circuit board 102, the components 404 of the holder 104 can be electrically affixed to corresponding components 402 of the circuit board 102, such as via solder. FIG. 4 thus shows that the techniques disclosed herein are applicable to both SMT and through-hole technologies.

Figure 5:
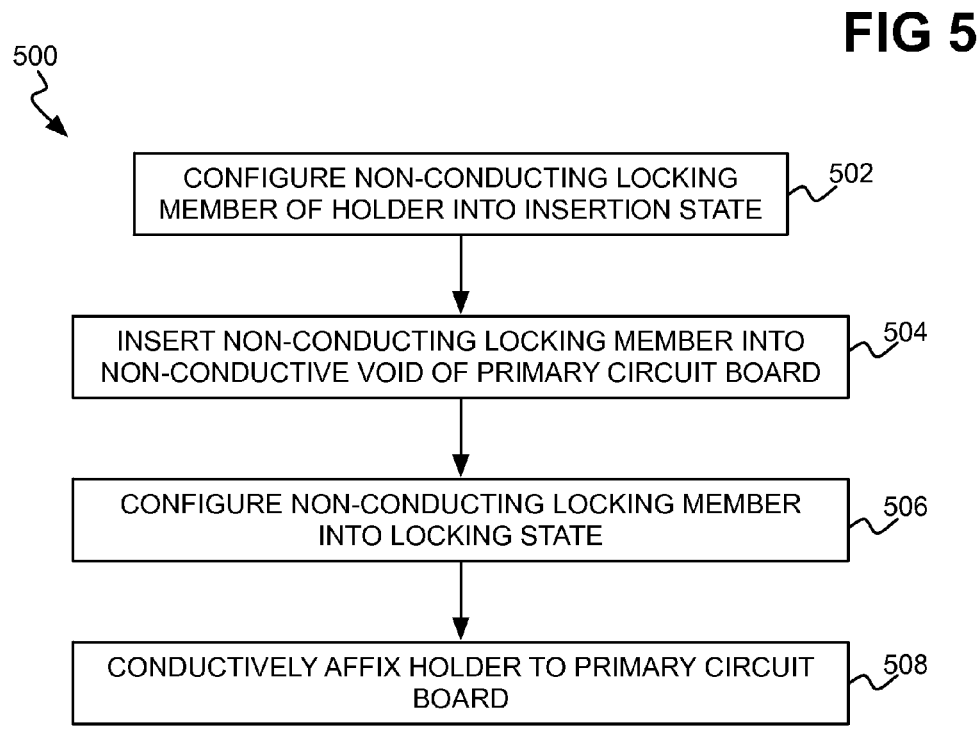
FIG. 5 is a flowchart of an example method for conductively affixing a holder to a primary circuit board.

FIG. 5 shows an example method 500 to assemble the circuit board assembly 100 that has been described. The non-conducting locking member 124 of the holder 104 is configured to be in an insertion state in which the locking member 124 can be inserted into the non-conductive void 112 of the primary circuit board 102 (502). The non-conducting locking member 104 while in this state is inserted into the non-conductive void 112 (504). As noted above, configuring the non-conducting locking member 124 into an insertion state can be achieved automatically via or during insertion thereof into the non-conductive void 112.

Once the non-conducting locking member 124 of the holder 104 has been inserted into the non-conductive void 112 of the primary circuit board 102, the locking member 124 is configured to be in a locking state in which the holder 104 is secured to the primary circuit board 102 (506). Configuring the non-conducting locking member 124 into a locking state can be achieved automatically upon the locking member 104 being in the position depicted in FIGS. 1 and 4. That is, insertion of the non-conducting locking member 124 so that the flared ends of the fingers 126 are past the position 116 results in the locking member 124 entering a locking state.

While the non-conducting locking member 124 of the holder is in a locking state, a conductive part of the holder 104 is conductively affixed to a conductive part of the primary circuit board 102 (508). This can be achieved by reflowing solder between these conductive parts, for instance. After cooling of the solder, the holder 104 is conductively affixed to the primary circuit board 102, and the secondary circuit board 106 can be removably inserted into the holder 104 so that the secondary circuit board 106 and the primary circuit board 102 are conductively interconnected via the holder 104.

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:

1. A circuit board assembly comprising:
   a primary circuit board having a front surface, a back surface, and a non-conductive void having first planar dimensions through a first portion of a thickness of the primary circuit board extending from the front surface to a position between the front surface and the back surface, and having second planar dimensions through a second portion of the thickness extending from the position at least towards the back surface, the first planar dimensions different than the second planar dimensions; and a holder receptive to a secondary circuit board, the holder including a non-conducting locking member insertable into the non-conductive void at the front surface of the primary circuit board to secure the holder to the front surface of the primary circuit board while a conductive part of the holder is conductively affixed to a conductive part of the primary circuit board, wherein the primary circuit board has an intermediate surface at the position that is parallel to the front surface and the back surface, the non-conducting locking member securing the holder to the primary circuit board between the front surface and the intermediate surface of the primary circuit board.

2. The circuit board assembly of claim 1, wherein the first planar dimensions being different than the second planar dimensions permit the thickness of the primary circuit board to be greater than a specified maximum primary circuit board thickness of the non-conducting locking member of the holder.

3. The circuit board assembly of claim 1, wherein the first planar dimensions are smaller than the second planar dimensions.

4. The circuit board assembly of claim 1, wherein the non-conductive void comprises a counterbore having a maximum diameter corresponding to the second planar dimensions and a minimum diameter corresponding to the first planar dimensions.

5. The circuit board assembly of claim 1, wherein the non-conductive void comprises a polygonal slot being smaller at the front surface than at the back surface.

6. The circuit board assembly of claim 1, wherein the non-conductive void comprises a pocket being smaller at the front surface than towards the back surface.

7. The circuit board assembly of claim 1, wherein the non-conducting locking member comprises a plurality of fingers having flared ends, the fingers compressed against one another in an insertion state in which the flared ends fit the non-conductive void at the first planar dimensions, the fingers not compressed against one another and defining a gap therebetween in a locking state in which the flared ends do not fit the non-conductive void at the first planar dimensions.

8. The circuit board assembly of claim 1, wherein the holder comprises a socket receptive to the secondary circuit board.

9. The circuit board assembly of claim 1, wherein the secondary circuit board comprises a memory module.

10. The circuit board assembly of claim 1, wherein the conductive part of the holder is conductively affixed to the conductive part of the primary circuit board in a conductively plated through-hole manner.

11. The circuit board assembly of claim 1, wherein the conductive part of the holder is conductively affixed to the conductive part of the primary circuit board in a surface-mount technology (SMT) manner.

12. The circuit board assembly of claim 1, wherein the conductive part of the holder is conductively affixed to the conductive part of the primary circuit board via solder.

13. A circuit board comprising:
a substrate having a front surface, a back surface, and a thickness defined from the front surface to the back surface;
a conductive part receptive to conductive affixing to a conductive part of a secondary circuit board holder; and
a non-conductive void having first planar dimensions through a first portion of the thickness from the front surface to a position between the front surface and the back surface, and having second planar dimensions through a second portion of the thickness from the position at least towards the back surface, the first planar dimensions different than the second planar dimensions, wherein the non-conductive void is receptive to insertion of a non-conducting locking member of the secondary circuit board holder to secure the secondary circuit board while the conductive part of the secondary circuit board holder is conductively affixed to the conductive part of the circuit board, wherein the substrate has an intermediate surface at the position that is parallel to the front surface and the back surface, the non-conducting locking member to secure the holder to the substrate between the front surface and the intermediate surface of the substrate.

14. The circuit board of claim 13, wherein the first planar dimensions being different than the second planar dimensions permit the thickness to be greater than a maximum thickness specification of the non-conducting locking member of the secondary circuit board holder.

15. The circuit board of claim 13, wherein the non-conductive void comprises a counterbore having a maximum diameter corresponding to the second planar dimensions and a minimum diameter corresponding to the first planar dimensions.

16. The circuit board of claim 13, wherein the non-conductive void comprises a polygonal slot being smaller at the front surface than at the back surface.

17. The circuit board of claim 13, wherein the non-conductive void comprises a pocket being smaller at the front surface than towards the back surface.

18. A method comprising:
configuring a non-conducting locking member of a secondary circuit board holder into an insertion state;
while the non-conducting locking member is in the insertion state, inserting the non-conducting locking member into a non-conductive void of a primary circuit board having a front surface and a back surface, the non-conductive void having first planar dimensions through a first portion of a thickness of the primary circuit board extending from the front surface to a position between the front surface and the back surface, and having second planar dimensions through a second portion of the thickness extending from the position at least towards the back surface, the first planar dimensions different than the second planar dimensions;
once the non-conducting locking member has been inserted into the non-conductive void, configuring the non-conducting locking member into a locking state in which the secondary circuit board holder is secured to the front surface of the primary circuit board; and
while the non-conducting locking member is in the locking state, conductively affixing a conductive part of the secondary circuit board holder to a conductive part of the primary circuit board, wherein configuring the non-conducting locking member into the insertion state comprises compressing a plurality of fingers of the non-conducting locking member that have flared ends against one another such that the flared ends fit the non-conductive void at the first planar dimensions, and wherein configuring the non-conducting locking member into the locking state comprises releasing the fingers of the non-conducting locking member so that the fingers are no longer compressed against one another and instead define a gap therebetween such that the flared ends no longer fit the non-conductive void at the first planar dimensions.

19. The method of claim 18, wherein conductively affixing the conductive part of the secondary circuit board holder to the conductive part of the primary circuit board comprises reflowing solder between the conductive part of the secondary circuit board holder and the conductive part of the primary circuit board.

\* \* \* \* \*

UNITED STATES PATENT AND TRADEMARK OFFICE
CERTIFICATE OF CORRECTION

| | | |
|---|---|---|
| PATENT NO. | : 8,939,791 B2 | Page 1 of 1 |
| APPLICATION NO. | : 13/751130 | |
| DATED | : January 27, 2015 | |
| INVENTOR(S) | : Wai M. Ma et al. | |

It is certified that error appears in the above-identified patent and that said Letters Patent is hereby corrected as shown below:

On the title page, item (72), in the inventors, Jefferson L. Watson should be:

-- Jefferson L. Walton --

Signed and Sealed this
Twenty-eighth Day of April, 2015

Michelle K. Lee
*Director of the United States Patent and Trademark Office*